United States Patent
Klem et al.

(10) Patent No.: US 8,299,497 B1
(45) Date of Patent: Oct. 30, 2012

(54) NEAR-INFRARED PHOTODETECTOR WITH REDUCED DARK CURRENT

(75) Inventors: John F. Klem, Albuquerque, NM (US); Jin K. Kim, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 330 days.

(21) Appl. No.: 12/827,587

(22) Filed: Jun. 30, 2010

(51) Int. Cl.
*H01L 31/33* (2006.01)

(52) U.S. Cl. ........ 257/184; 257/188; 257/441; 257/443; 257/E21.09

(58) Field of Classification Search .......... 257/184–188, 257/441–443
See application file for complete search history.

(56) References Cited

U.S. PATENT DOCUMENTS

| 7,687,871 | B2 | 3/2010 | Maimon |
| 7,737,411 | B2 | 6/2010 | Gunapala et al. |
| 2005/0012113 | A1* | 1/2005 | Sheu et al. ............ 257/184 |
| 2008/0111152 | A1* | 5/2008 | Scott et al. ............ 257/188 |
| 2009/0256231 | A1 | 10/2009 | Klipstein |
| 2010/0072514 | A1 | 3/2010 | Ting et al. |

OTHER PUBLICATIONS

S. Maimon, et al, nBn detector, an infrared detector with reduced dark current and higher operating temperature, 2006 American Institute of Physics, Applied Physics Letters 89, 151109 (2006).
J. F. Klem, et al, Mesa-isolated InGaAs photodetectors with low dark current, 2009 American Institute of Physics, Applied Physics Letters 95, 031112 (2009).
J. F. Klem, et al, Comparison of nBn mid-wave barrier infrared photodetectors, Proc. of SPIE vol. 7608 76081P-1, http://spiedl.org/terms.

* cited by examiner

*Primary Examiner* — Duhng A. Le
(74) *Attorney, Agent, or Firm* — Olivia J. Tsai

(57) ABSTRACT

A photodetector is disclosed for the detection of near-infrared light with a wavelength in the range of about 0.9-1.7 microns. The photodetector, which can be formed as either an nBp device or a pBn device on an InP substrate, includes an InGaAs light-absorbing layer, an InAlGaAs graded layer, an InAlAs or InP barrier layer, and an InGaAs contact layer. The photodetector can detect near-infrared light with or without the use of an applied reverse-bias voltage and is useful as an individual photodetector, or to form a focal plane array.

23 Claims, 6 Drawing Sheets

NEAR-INFRARED PHOTODETECTOR WITH REDUCED DARK CURRENT

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to III-V compound semiconductor photodetectors, and in particular to such photodetectors having a barrier layer to provide an nBp or pBn structure.

BACKGROUND OF THE INVENTION

Photodetectors are widely used for light-sensing and imaging applications. For sensing of low light levels, the sensitivity of photodetectors is limited by various sources of noise which result in a dark current in the absence of any light incident onto the photodetectors. To reduce the dark current and thereby improve the sensitivity of a photodetector cooling of the photodetector is generally required.

The photodetectors of the present invention overcome the limitations of the prior art by providing a barrier layer which separates a light-absorbing layer which is doped n-type or p-type and a contact layer having a doping type which is opposite that of the light-absorbing layer. The barrier layer blocks a flow of minority carriers from the contact layer to the light-absorbing layer and also eliminates surface leakage currents, thereby reducing the dark current in the photodetectors of the present invention.

The photodetectors of the present invention also utilize a graded layer between the light-absorbing layer and the barrier layer so that a valence band energy level of the barrier layer need not be substantially equal to the valence band energy level of the light-absorbing layer when the light-absorbing layer is n-type doped, and so that a conduction band energy level of the barrier layer need not be substantially equal to the conduction band energy level of the light-absorbing layer when the light-absorbing layer is p-type doped. The use of a graded layer in the photodetectors of the present invention relaxes the requirements on the barrier layer and permits the use of the III-V compound semiconductor materials indium aluminum gallium arsenide (InAlGaAs) and indium phosphide (InP) for the barrier layer when the light-absorbing layer comprises indium gallium arsenide (InGaAs).

These and other advantages of the present invention will become evident to those skilled in the art.

SUMMARY OF THE INVENTION

The present invention relates to a photodetector which comprises an indium phosphide (InP) substrate with a plurality of III-V compound semiconductor layers epitaxially grown on the InP substrate, including a light-absorbing layer comprising indium gallium arsenide (InGaAs) located above the InP substrate, an indium aluminum gallium arsenide (InAlGaAs) graded layer located above the light-absorbing layer, a barrier layer comprising indium aluminum arsenide (InAlAs) or InP located above the InAlGaAs graded layer, and a contact layer comprising InGaAs located above the barrier layer. The barrier layer has an energy level (i.e. a valence band energy level or a conduction band energy level) which is different (i.e. offset) from the energy level of the light-absorbing layer. In the photodetector, a first electrode is electrically connected to the light-absorbing layer; and a second electrode is electrically connected to the contact layer. A portion of the contact layer can be etched down to the barrier layer to define a lateral extent of the photodetector.

In certain embodiments of the present invention, at least one of the first and second electrodes can have an annular shape to admit light into the light-absorbing layer for detection thereof. In other embodiments of the present invention, both the first and second electrodes can be located on the same side of the InP substrate. The detected light can have a wavelength in the range of about 0.9 microns to about 1.7 microns, and is referred to herein as near-infrared light.

In some embodiments of the present invention, the light-absorbing layer can be n-type doped, with the photodetector being an nap photodetector. In other embodiments of the present invention, the light-absorbing layer can be p-type doped, with the photodetector being a pBn photodetector.

A last-grown portion of the light-absorbing layer can have a dopant concentration which is greater (e.g. by up to about one order of magnitude or more) than the dopant concentration of the remainder of the light-absorbing layer; and a first-grown portion of the barrier layer can be doped with a doping type which is opposite the doping type of the light-absorbing layer. The remainder of the barrier layer can be undoped. The last-grown portion of the light-absorbing layer can be, for example, a few nanometers thick, and the first-grown portion of the barrier layer can also be a few nanometers thick.

When the barrier layer comprises InAlAs, the InAlGaAs graded layer can comprise an effective semiconductor alloy composition $In_Y(Al_XGa_{1-X})_{1-Y}As$, with Y being selected to substantially lattice-match the graded layer to the InP substrate (e.g. Y≈0.53), and with X being substantially equal to zero (i.e. X≈0) proximate to the light-absorbing layer, and with X being substantially equal to unity (i.e. X≈1) proximate to the InAlAs barrier layer.

In general, when the light-absorbing layer is p-type doped so that the minority carriers are electrons, the InAlGaAs graded layer can comprise an effective semiconductor alloy composition $In_Y(Al_XGa_{1-X})_{1-Y}As$, with Y being selected to substantially lattice-match the graded layer to the InP substrate, and with X being substantially equal to zero proximate to the light-absorbing layer, and with X having a value at a location proximate to the barrier layer to provide a conduction band energy level of the InAlGaAs graded layer which is substantially equal to the conduction band energy level of the barrier layer. And, when the light-absorbing layer is n-type doped so that the minority carriers are holes, the InAlGaAs graded layer can comprise the effective semiconductor alloy composition $In_Y(Al_XGa_{1-X})_{1-Y}As$ with Y being selected to substantially lattice-match the graded layer to the InP substrate, and with X being substantially equal to zero proximate to the light-absorbing layer, and with X having a value at a location proximate to the barrier layer to provide a valence band energy level of the InAlGaAs graded layer which is substantially equal to the valence band energy level of the barrier layer.

The present invention also relates to a photodetector which comprises an InP substrate; a plurality of III-V compound semiconductor layers epitaxially grown on the InP substrate including a light-absorbing layer comprising InGaAs located above the InP substrate, with the InGaAs light-absorbing layer being n-type doped; an InAlGaAs graded layer located above the light-absorbing layer; a barrier layer comprising InAlAs located above the InAlGaAs graded layer, with the barrier layer having a valence band energy level which is different from the valence band energy level of the light-absorbing layer; and a contact layer comprising InGaAs located above the barrier layer, with the InGaAs contact layer being p-type doped. A first electrode in the photodetector is electrically connected to the light-absorbing layer; and a second electrode is electrically connected to the contact layer. A portion of the contact layer can be etched down to the barrier layer to define a lateral extent of the photodetector. In some embodiments of the present invention, one or both of the first and second electrodes can have an annular shape.

In certain embodiments of the photodetector, a last-grown portion of the light-absorbing layer can have an n-type dopant concentration which is greater (e.g. by up to about one order of magnitude or more) than the dopant concentration of the remainder of the light-absorbing layer, and a first-grown portion of the barrier layer can be p-type doped, with the remainder of the barrier layer being undoped (i.e. not intentionally doped).

The InAlGaAs graded layer can comprise an effective semiconductor alloy composition $In_Y(Al_XGa_{1-X})_{1-Y}As$, with Y being selected to substantially lattice-match the graded layer to the InP substrate, and with X being substantially equal to zero proximate to the InGaAs light-absorbing layer, and with X being substantially equal to unity proximate to the InAlAs barrier layer.

The present invention further relates to a photodetector which comprises an InP substrate; a plurality of III-V compound semiconductor layers epitaxially grown on the InP substrate including a light-absorbing layer comprising InGaAs located above the InP substrate, with the InGaAs light-absorbing layer being p-type doped; an InAlGaAs graded layer located above the light-absorbing layer; a barrier layer comprising InAlAs located above the InAlGaAs graded layer, with the barrier layer having a conduction band energy level which is different from the conduction band energy level of the light-absorbing layer; and a contact layer comprising InGaAs located above the barrier layer, with the InGaAs contact layer being n-type doped. A first electrode in the photodetector can be electrically connected to the light-absorbing layer; and a second electrode can be electrically connected to the contact layer. A portion of the contact layer can be etched down to the barrier layer to define a lateral extent of the photodetector.

In certain embodiments of the present invention, a last-grown portion of the light-absorbing layer can have a p-type dopant concentration which is greater (e.g. by up to about one order of magnitude or more than the dopant concentration of the remainder of the light-absorbing layer; and a first-grown portion of the barrier layer can be n-type, with the remainder of the barrier layer being undoped.

The InAlGaAs graded layer can comprise an effective semiconductor alloy composition $In_Y(Al_XGa_{1-X})_{1-Y}As$, with Y being selected to substantially lattice-match the graded layer to the InP substrate, and with X being substantially equal to zero proximate to the light-absorbing layer, and with X being substantially equal to unity at a location proximate to the barrier layer.

The present invention also relates to a photodetector which comprises an InP substrate; a plurality of III-V compound semiconductor layers epitaxially grown on the InP substrate, including a light-absorbing layer comprising InGaAs located above the InP substrate, with the InGaAs light-absorbing layer being p-type doped; an InAlGaAs graded layer located above the light-absorbing layer; a barrier layer comprising InP located above the InAlGaAs graded layer, with the InP barrier layer having a conduction band energy level which is different from the conduction band energy level of the light-absorbing layer; and a contact layer comprising InGaAs located above the barrier layer, with the InGaAs contact layer being n-type doped. A first electrode is provided in the photodetector and is electrically connected to the light-absorbing layer; and a second electrode is electrically connected to the contact layer. A portion of the contact layer can be etched down to the barrier layer to define a lateral extent of the photodetector.

In some embodiments of the present invention, a last-grown portion of the light-absorbing layer can be epitaxially grown with a p-type dopant concentration which is greater (e.g. by about one order of magnitude or more) than the dopant concentration of the remainder of the light-absorbing layer, and a first-grown portion of the barrier layer can be n-type doped, with the remainder of the barrier layer being undoped.

The InAlGaAs graded layer can comprise an effective semiconductor alloy composition $In_Y(Al_XGa_{1-X})_{1-Y}As$, with Y being selected to substantially lattice-match the graded layer to the InP substrate, and with X being substantially equal to zero proximate to the InGaAs light-absorbing layer, and with X having a value proximate to the InP barrier layer to provide a conduction band energy level of the graded layer which is substantially equal to the conduction band energy level of the barrier layer.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
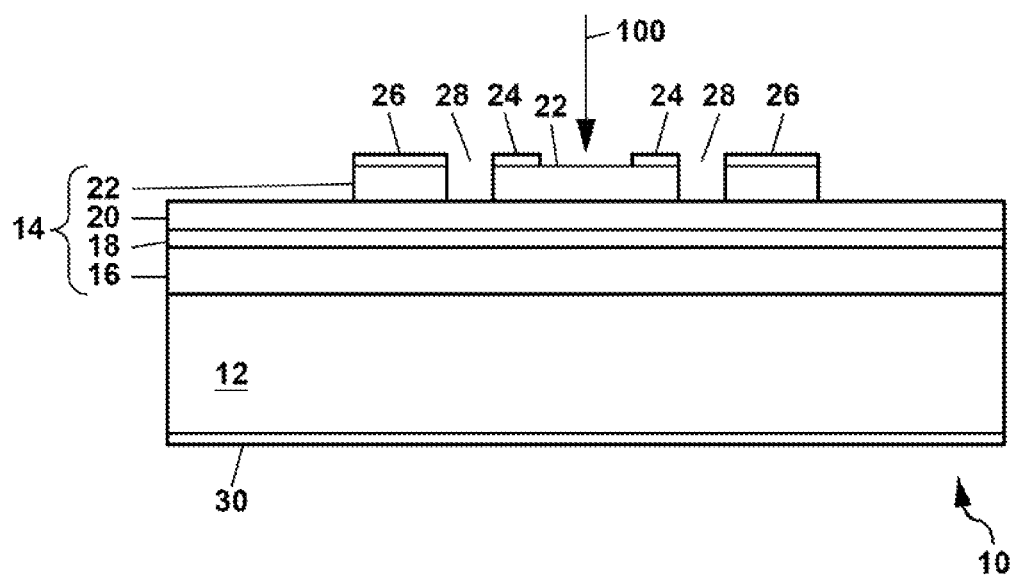
FIG. 1 shows a schematic cross-section view of a first example of a photodetector formed according to the present invention.

FIG. 1 shows a schematic cross-section view of a first example of a photodetector 10 formed according to the present invention. In the example of FIG. 1, the photodetector 10, which is useful to detect near-infrared light 100 in a wavelength range of about 0.9-1.7 μm, comprises an indium phosphide (InP) substrate 12 on which a plurality of III-V compound semiconductor layers 14 are epitaxially grown. These III-V compound semiconductor layers 14 include an indium gallium arsenide (InGaAs) light-absorbing layer 16, an indium aluminum gallium arsenide (InAlGaAs) graded layer 18, a barrier layer 20 comprising either indium aluminum arsenide (InAlAs) or InP, and an InGaAs contact layer 22.

The InP substrate 12 can include a thin ($\leq 1$ μm) n-type-doped InP buffer layer (not shown) which can be initially epitaxially grown on the InP substrate 12 and is considered herein to be a part of the InP substrate 12. The InP substrate 12 can be either n-type doped or p-type doped to about $10^{18}$ cm$^{-3}$ with the exact doping type of the substrate 12 being the same as the doping type of the light-absorbing layer 16 when an electrical connection to the light-absorbing layer 16 is made through the substrate 12. When the electrical connection to the light-absorbing layer 16 is not made through the InP substrate 12, the substrate 12 can be semi-insulating. The InP substrate 12 can have a thickness up to a few hundred microns (μm).

The InP buffer layer and the plurality of III-V compound semiconductor layers 14 can be epitaxially grown, for example, by molecular beam epitaxy (MBE) at a growth temperature in the range of about 470-510° C. using group III sources, arsenic, and cracked phosphine. Silicon can be used as an n-type dopant for the III-V compound semiconductor layers 14, and beryllium can be used as a p-type dopant. Those skilled in the art will understand that other types of epitaxial growth methods known to the art, including metal-organic chemical vapor deposition (MOCVD) can be used for epitaxial growth of the InP buffer layer and the plurality of III-V compound semiconductor layers 14. Those skilled in the art will also understand that other types of n-type and p-type dopants as known to the art can be used for doping the III-V compound semiconductor layers 14 during epitaxial growth.

The epitaxial growth of the III-V compound semiconductor layers 14 can be commenced by growing a digitally-graded InAlGaAs layer (not shown) having the same doping type as the InP substrate 12. This InAlGaAs layer, which can be used to provide a low resistance for electron transport between the InGaAs light-absorbing layer 16 and the InP substrate 12, can have a thickness of, for example, 25 nanometers (nm) and can be digitally graded, for example, by growing a plurality of alternating layers of the III-V compound semiconductor alloys $In_{0.52}Al_{0.48}As$ and $In_{0.53}Ga_{0.47}As$ with the thicknesses of these layers being varied during epitaxial growth to provide an effective semiconductor alloy composition $In_Y(Al_XGa_{1-X})_{1-Y}As$ which is graded in composition to provide a smooth transition in band-edge energy between the InP substrate 12 and the InGaAs light-absorbing layer 16.

The InGaAs light-absorbing layer 16 can be n-type doped or p-type doped to a doping level of, for example, about $1 \times 10^{16}$ cm$^{-3}$ or more depending upon a particular type of photodetector 10 (e.g. nBp or pBn) being formed. The InGaAs light-absorbing layer 16 can have a layer thickness of, for example, 2 μm and will generally be substantially lattice matched to the InP substrate 12 (e.g. a semiconductor alloy composition $In_{0.53}Ga_{0.47}As$).

The InAlGaAs graded layer 18 can be epitaxially grown above the InGaAs light-absorbing layer 16 and can be undoped (i.e. not intentionally doped). The InAlGaAs graded layer 18 can have an overall layer thickness of, for example, 50 nanometers (nm). The InAlGaAs graded layer 18 as defined herein can be either a compositionally-graded layer 18 of the quaternary III-V compound semiconductor alloy $In_Y(Al_XGa_{1-X})_{1-Y}As$ in which the composition $Y \approx 0.53$ and the composition X is varied during epitaxial growth, or can be a digitally-graded layer 18 formed from plurality of thin (e.g. a few monolayers thick) alternating layers of two different ternary III-V compound semiconductor alloys InGaAs and InAlAs (e.g. $In_{0.53}Ga_{0.47}As$ and $In_{0.52}Al_{0.48}As$) in which the layer thicknesses of the alternating InGaAs and InAlAs layers are varied during epitaxial growth. In both cases above, the graded layer 18 has an effective semiconductor alloy composition $In_Y(Al_XGa_{1-X})_{1-Y}As$ which is graded over the thickness of the layer 18.

When the barrier layer 20 comprises InAlAs, the InAlGaAs graded layer 18 can have an effective bandgap energy which is substantially equal to the bandgap energy of the InGaAs light-absorbing layer 16 on a side of the InAlGaAs graded layer 18 which contacts the light-absorbing layer 16; and the InAlGaAs graded layer 18 can have an effective bandgap energy which is substantially equal to that of the InAlAs barrier layer 20 on an opposite side of the graded layer 18 which is in contact with the barrier layer 20. This can be done either by compositionally grading or digitally grading the layer 18 to provide an effective semiconductor alloy composition $In_Y(Al_XGa_{1-X})_{1-Y}As$ with Y being selected to provide a substantial lattice matching to the InP substrate 12 (e.g. $Y \approx 0.53$) and with $X \approx 0$ near the InGaAs light-absorbing layer 16, and with $X \approx 1$ near the InAlAs barrier layer 20.

In general according to the present invention, when the InGaAs light-absorbing layer 16 is n-type doped so that the minority carriers are holes, the InAlGaAs in the graded layer 18 can comprise an effective semiconductor alloy composition $In_Y(Al_XGa_{1-X})_{1-Y}As$ with $Y \approx 0.53$ and with X being substantially equal to zero (i.e. $X \approx 0$) at a location proximate to the InGaAs light-absorbing layer 16, and with X being substantially equal to unity (i.e. $X \approx 1$) at a location proximate to the barrier layer 20 so that a valence band energy of the InAlGaAs graded layer 18 will be substantially equal to the valence band energy of the barrier layer 20. And, when the light-absorbing layer 16 is p-type doped so that the minority carriers are electrons, the InAlGaAs in the graded layer 18 can comprise an effective semiconductor alloy composition $In_Y(Al_XGa_{1-X})_{1-Y}As$ with $Y \approx 0.53$ and with X being substantially equal to zero proximate to the InGaAs light-absorbing layer, and with X having a value at a location proximate to the barrier layer 20 wherein a conduction band energy of the InAlGaAs graded layer 18 is substantially equal to the conduction band energy of the barrier layer 20.

To oppose a quasi-electric field produced by the grading of the InAlGaAs graded layer 18, a last-grown portion (e.g. about 5 nm thick) of the InGaAs light-absorbing layer 16 can be doped with a dopant concentration which is larger (e.g. by up to about one order of magnitude or more) than the dopant concentration of the remainder of the InGaAs light-absorbing layer 16; and a first-grown portion (e.g. about 5 nm thick) of the barrier layer 20 can be oppositely doped with a dopant concentration which is about the same as that of the last-grown portion of the InGaAs light absorbing layer 16. This increased doping of the last-grown portion of the InGaAs light-absorbing layer 16 and the first-grown portion of the barrier layer 20, which is referred to herein as delta-doping (i.e. δ-doping), produces a electric field which can substantially reduce or cancel out the quasi-electric field produced by the compositional grading of the InAlGaAs graded layer 18.

As an example, to form an nBp photodetector 10 (where n represents the doping type of the light-absorbing layer 16, B represents the barrier layer 20 and p represents the doping type of the contact layer 22) the last-grown portion of the light-absorbing layer 16 can be doped n-type to about $7 \times 10^{17}$ $cm^{-3}$ during epitaxial growth, with the remainder of the light-absorbing layer 16 being doped n-type to about $1 \times 10^{16}$ $cm^{-3}$. The first-grown portion of the barrier layer 20 can be doped p-type to about $7 \times 10^{17}$ $cm^{-3}$. The remainder of the barrier layer 20 can be undoped (i.e. not intentionally doped). The barrier layer 20 can comprise either InAlAs (e.g. $In_{0.52}Al_{0.48}As$) or InP, and can have a thickness of, for example, about 100 nm. Ideally, the barrier layer 20 should be sufficiently thick to limit a tunneling of carriers from the contact layer 22 through the barrier layer 20, and also should be sufficiently high in energy (i.e. a conduction band offset energy for the barrier layer 20 in an nBp photodetector 10 or a valence band offset energy for the barrier layer 20 in a pBn photodetector) to limit a thermal excitation of carriers from the contact layer 22 over the barrier layer 20 at an operating temperature of the photodetector 10.

In FIG. 1, the barrier layer 20 overlies the InGaAs light-absorbing layer 16 and InAlGaAs graded layer 18 and acts as a passivation layer to eliminate surface currents which could otherwise occur if these layers 16 and 18 were exposed in the vicinity of an active area of the photodetector 10. This elimination of surface currents reduces a dark current in an electrical output signal of the photodetector 10. Additionally, the barrier layer 20 blocks a flow of carriers (i.e. electrons and/or holes) from the contact layer 22 into the light-absorbing layer 16 while allowing photogenerated carriers from the light-absorbing layer 16 to generate the electrical output signal for the photodetector 10. By eliminating surface currents and by blocking the flow of carriers from the contact layer 22, noise in the electrical output signal for the photodetector 10 is reduced, thereby providing a larger signal-to-noise ratio (SNR) for the photodetector 10, or allowing the photodetector 10 to be operated at a higher temperature (e.g. higher than 200° K).

The InGaAs contact layer 22 can be epitaxially grown above the barrier layer 20 with a first-grown portion (e.g. about 100 nm thick) of the InGaAs contact layer 22 being p-type or n-type doped to about $10^{18}$ $cm^{-3}$ ending upon whether an nBp or pBn photodetector 10 is being formed, and with a last-grown portion (e.g. about 50 nm thick) of the InGaAs contact layer 22 being doped to about $10^{19}$ $cm^{-3}$ with the same doping type.

Embodiments of the present invention wherein the photodetector 10 comprises an nBp photodetector 10 or a pBn photodetector are useful for detecting near-infrared light 100 without the need for any bias voltage although, in some cases, a small reverse-bias voltage can be applied across the photodetector 10 to increase a dynamic resistance of the photodetector 10.

After epitaxial growth of the III-V compound semiconductor layers 14, a top electrode 24 can be formed over the InGaAs contact layer 22 using a photolithographically-defined mask layer (not shown) and lift-off. The top electrode 24 can be deposited over the mask layer and in contact with an exposed portion of the contact layer 22 by evaporation or sputtering. The top electrode 24 can comprise any type of metallization known to the art for use with III-V compound semiconductor devices. As examples, when the InGaAs contact layer 22 is p-type doped, the top electrode 24 can comprise a Ti/Pt/Au metallization formed by depositing 10 nm of titanium (Ti), 20 nm of platinum (Pt) and 200 nm of gold (Au); and when the InGaAs contact layer 22 is n-type doped, the top electrode 24 can comprise a Ge/Au/Ni/Au metallization formed by depositing 26 nm of germanium (Ge), 54 nm of gold, 15 nm of nickel (Ni) and 200 nm of gold in that order. At the same time the top electrode 24 is formed, a guard ring 26 can be optionally formed about the photodetector 10 as shown in FIG. 1 using the same process steps which are used to form the top electrode 24.

The top electrode 24 in the example of FIG. 1 can have an annular shape to allow light 100 to be incident onto the photodetector 10 from a top side thereof. An annular top electrode 24 can be used, for example, when the InGaAs contact layer 22 is etched to form a mesa with a lateral extent of about 25 μm or larger. For a mesa in the InGaAs contact layer 22 which is smaller than about 25 μm or when a one-dimensional or two-dimensional array of photodetectors 10 is being formed on a common InP substrate 12, the light 100 can be incident onto a bottom side of the substrate 12 and transmitted through the substrate 12 to each photodetector 10 (see e.g. FIG. 6). In these later cases, the top electrode 24 can have an arbitrary shape (e.g. square, rectangular or circular).

After forming the top electrode 24 and the optional guard ring 26, a photolithographically-formed etch mask (not shown) can be provided to cover the top electrode 24 and guard ring 26 (also referred to herein as a guard electrode) and a portion of the InGaAs contact layer 22 beneath the electrodes 24 and 26 in preparation for etching down through a portion of the contact layer 22 to the barrier layer 20 to define a lateral extent (i.e. an active area size) of the photodetector 10. This etching step can be performed, for example, using an etchant comprising 1:4:45 $H_3PO_4$:$H_2O_2$:$H_2O$ (by volume). This etching step can be timed and terminated upon reaching the InAlAs barrier layer 20, or after etching partway through the barrier layer 20.

In the example of FIG. 1, an annular trench 28 can be etched down through the contact layer 22 between the top electrode 24 and the guard electrode 26 to define the lateral extent of the photodetector 10. In other embodiments of the present invention, a plurality of straight trenches which intersect can be used to define the shape and active area size of one or more photodetectors 10 being formed on the InP substrate 12. The remainder of the InGaAs contact layer 22, which is outside of the photodetector 10 and guard ring 26 and unprotected by the etch mask, can also be removed as shown in FIG. 1.

In the example of FIG. 1, a bottom electrode 30 can be deposited or sputtered over a bottom surface of the InP substrate 12 to provide an electrical connection through the InP substrate 12 to the InGaAs light-absorbing layer 16. The bottom electrode 30 can comprise a full-surface metallization using any type of metallization known to the art for use with InP substrates. As examples, the bottom electrode 30 can comprise a Ge/Au/Ni/Au metallization as described previously when the InP substrate 12 is n-type doped, and can comprise a Ti/Pt/Au metallization as previously described when the InP substrate 12 is p-type doped. In other embodiments of the present invention, the bottom electrode 30 can formed with an annular shape to allow the near-infrared light 100 to be transmitted through the InP substrate 12. In yet other embodiments of the present invention, the bottom electrode 30 can located above the InGaAs light-absorbing layer 16. This can be done by etching down through a portion of the barrier layer 20 and the graded layer 18 to expose a portion of the InGaAs light-absorbing layer 16 with the bottom electrode 30 then being deposited onto this exposed portion of the light-absorbing layer 16 (see FIG. 6).

Figure 2:
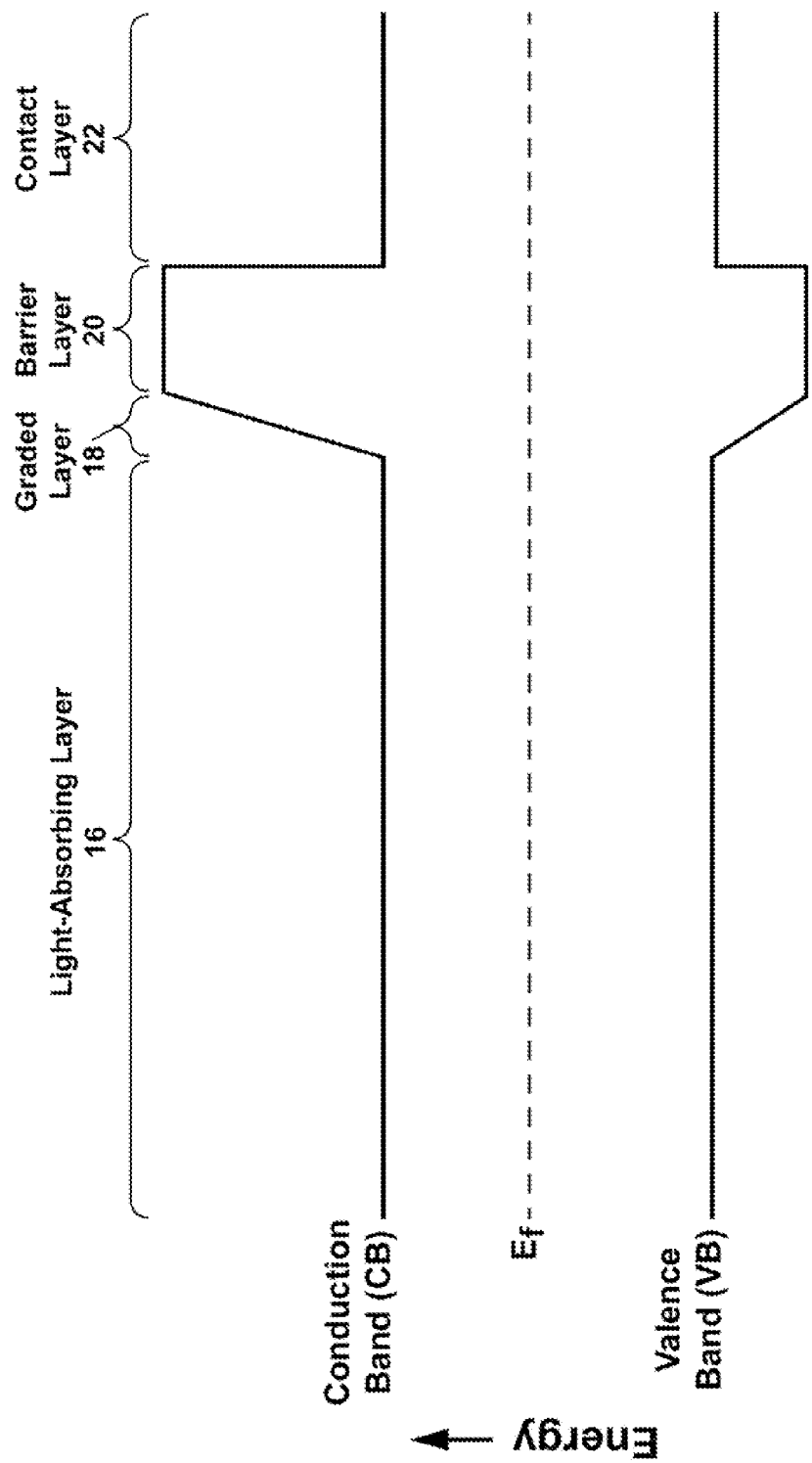
FIG. 2 shows a schematic energy level diagram for the photodetector in FIG. 1 with an InAlAs barrier layer to illustrate the energy levels in the valence and conduction bands for the III-V compound semiconductor layers from the light-absorbing layer to the contact layer in the absence of any doping in the III-V compound semiconductor layers. The Fermi level, $E_f$, is indicated by the dashed line.

FIGS. 2-4 show a series of schematic energy level diagrams for relevant portions of the photodetector 10 of the present invention between the light-absorbing layer 16 and the contact layer 22. FIG. 2 shows a schematic energy level diagram in the absence of any doping for the various layers 16, 18, 20 and 22. In FIG. 2, the Fermi energy level, $E_f$, is centered between the valence and conduction energy levels and is indicated by a dashed line. The schematic energy level diagram of FIG. 2 is drawn for an InAlAs barrier layer 20. When an InP barrier layer 20 is used in the photodetector 10 of the present invention, the schematic energy level diagram differs from that of FIG. 2 in having a reduced offset energy (i.e. a difference or discontinuity in energy) in the conduction band energy level due to the barrier layer 20, and an increased offset energy in the valence band energy level.

According to the present invention, there are offsets (i.e. differences or discontinuities) in the energy levels of both the valence band (VB) and the conduction band (CB) between the light-absorbing layer 16 and the barrier layer 20. This is in contrast to other types of photodetectors employing a barrier layer which require that there be no offset in energy between the light-absorbing layer and the barrier layer for one of the valence band and the conduction band energy levels.

Figure 3A:
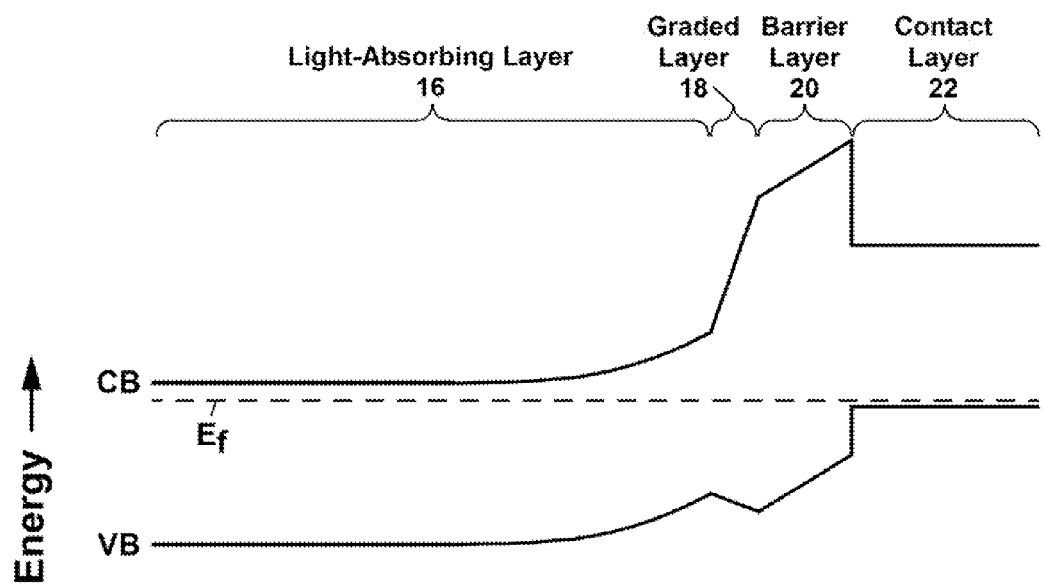
FIG. 3A illustrates how the energy level diagram of FIG. 2 is modified by the addition of n-type doping to the light-absorbing layer and p-type doping to the contact layer to form an nBp photodetector. No bias voltage is applied to the nBp photodetector for this energy level diagram.
Figure 3B:
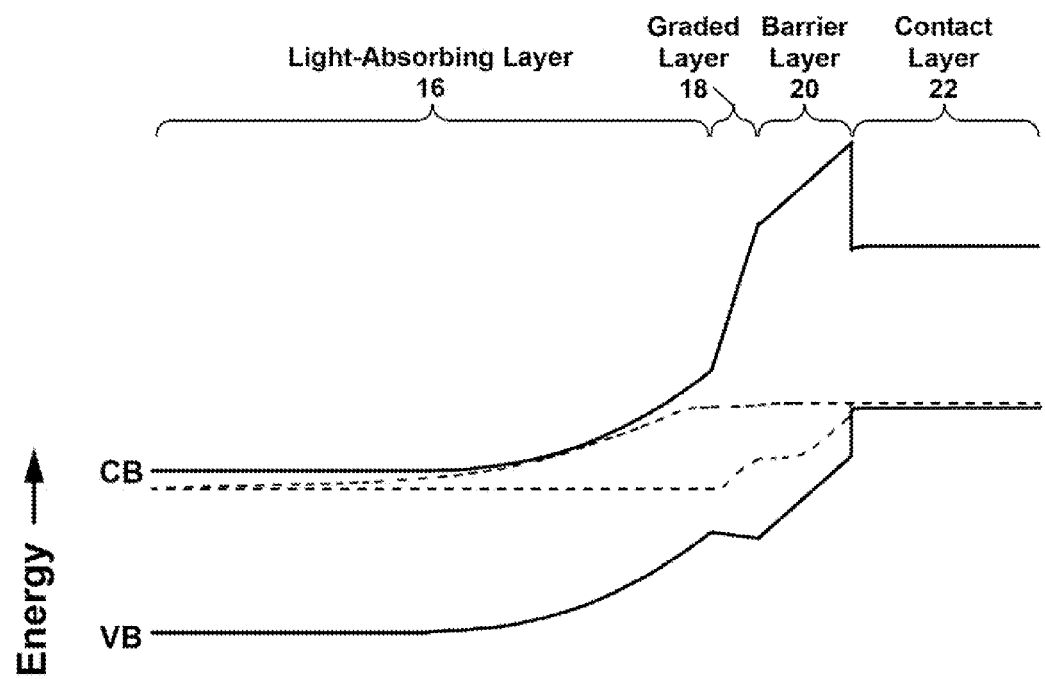
FIG. 3B illustrates how the energy level diagram of FIG. 3A is further modified with a reverse-bias voltage of −0.4 Volts applied across the nBp photodetector.

By providing the InAlGaAs graded layer 18 and using δ-doping in the graded layer 18 and the barrier layer 20, the effect of the offset in the valence band energy level for an nBp photodetector 10 can be substantially reduced (see FIGS. 3A and 3B). Similarly, the effect of the offset in the conduction band energy level for a pBn photodetector 10 can be substantially reduced by the InAlGaAs graded layer 18 and δ-doping in the layers 18 and 20 (see FIGS. 4A, 4B, 5A and 5B). The use of the InAlGaAs graded layer 18 and δ-doping in the photodetectors 10 of the present invention is advantageous since it allows the use of InAlAs or InP for the barrier layer 20 without the need for a substantially zero offset energy between the barrier layer 20 and the light-absorbing layer 16 as shown in FIG. 2.

FIG. 3A shows how the energy level diagram of FIG. 2 is modified for an nBp photodetector 10 with an InAlAs barrier layer 20 by doping of the III-V compound semiconductor layers 14 as described previously without any bias voltage being applied across the nBp photodetector 10. FIG. 3B shows the behavior of the valence and conduction band energy levels for this same device 10 with a small applied reverse-bias voltage.

In FIG. 3A, doping of the III-V compound semiconductor layers 14 in the nBp photodetector 10 shifts and bends the valence and conduction band energy levels so that the offset in the valence band energy level between the barrier layer 20 and the light-absorbing layer 16 is greatly reduced. This allows photogenerated holes, which are generated in the light-absorbing layer 16 from incident near-infrared light 100, to move across the InAlAs barrier layer 20 to the contact layer 22 in the absence of any applied reverse-bias voltage, with the photogenerated holes contributing to the electrical output signal of the nBp photodetector 10. Without any applied reverse-bias voltage, photogenerated electrons will also move out of the light-absorbing layer 16 to the bottom electrode 30 and further contribute to the electrical output signal of the photodetector 10. The substantial discontinuity in the conduction band energy level between the barrier layer 20 and the contact layer 22, however, blocks the transport of electrons from the contact layer 22 across the barrier layer 20 to the light-absorbing layer 16 and, thereby, reduces the dark current for the nBp photodetector 10. Thus, the nBp photodetector 10 of the present invention can provide a high responsivity without the need for any applied reverse-bias voltage. This provides an advantage over other types of photodetectors (e.g. nBn and pBp photodetectors) which must be biased to achieve a high responsivity.

In FIG. 3B, the application of a small reverse-bias voltage of, for example, −0.4 Volts across the nBp photodetector 10 can be optionally used to further shift and bend the conduction and valence energy bands to provide a slight improvement in performance of the nBp photodetector 10 by increasing a dynamic resistance of the photodetector 10. In FIG. 3B, the applied reverse-bias voltage does not appreciably reduce the conduction band energy barrier for electrons from the contact layer 22 so that these electrons from the contact layer 22 are blocked from moving across the barrier layer 20 in response to an electric field produced by the reverse-bias voltage and producing a noise current (also termed a dark current) in the electrical output signal of the photodetector 10. This maintains a high SNR for the photodetector 10 for the detection of near-infrared light 100.

In FIG. 3B, the Fermi level is split in the vicinity of the InAlAs barrier layer 20 by the applied reverse-bias voltage to form two quasi Fermi levels which are indicated using short-dash lines.

Figure 4A:
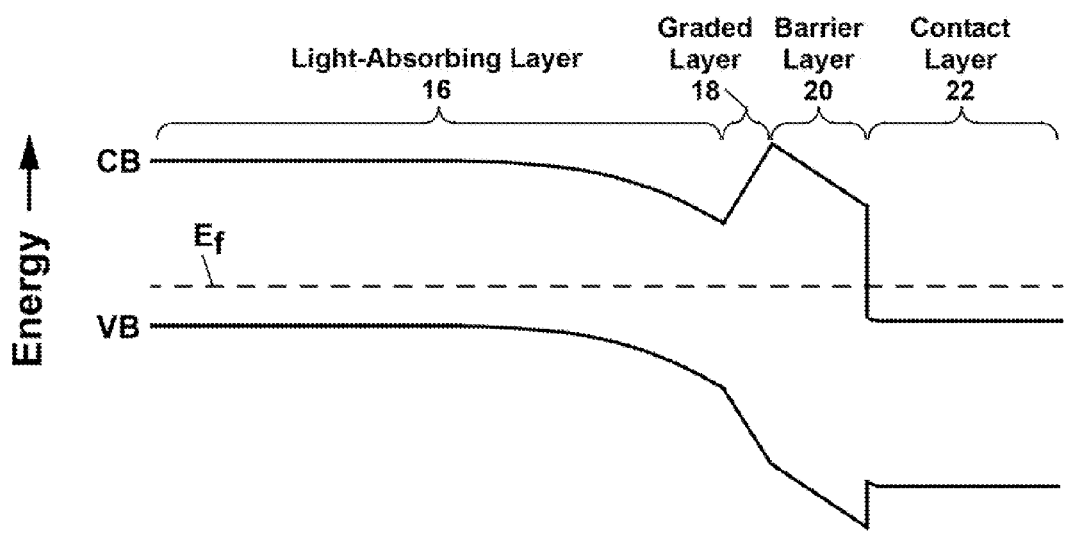
FIG. 4A illustrates how the energy level diagram of FIG. 2 is modified by the addition of p-type doping to the light-absorbing layer and n-type doping to the contact layer to form a pBn photodetector. No bias voltage is applied to the pBn photodetector for this energy level diagram.
Figure 4B:
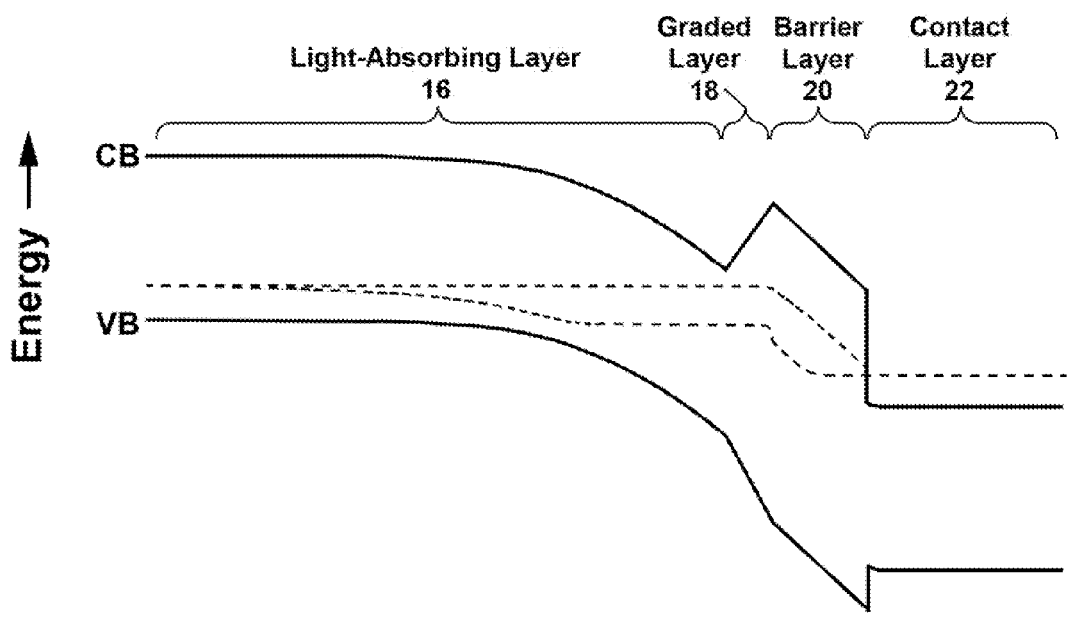
FIG. 4B illustrates how the energy level diagram of FIG. 4A is further modified with a reverse-bias voltage of 0.4 Volts applied across the pBn photodetector.

FIGS. 4A and 4B are similar to FIGS. 3A and 3B except for having a pBn structure for the photodetector 10, with the InGaAs light-absorbing layer 16 being p-type doped, and the InGaAs contact layer 22 being n-type doped. The barrier layer 20 in FIGS. 4A and 4B comprises InAlAs.

In FIG. 4A, doping of the III-V compound semiconductor layers 14 shifts and bends the conduction and valence band energy levels from those of the undoped structure in FIG. 2 in a sense which is opposite that of FIG. 3A due to the opposite doping of the layers 14. In the conduction band, the energy difference between the barrier layer 20 and the light-absorbing layer 16 is reduced by the doping of the layers 14, thereby facilitating the transport of the photogenerated electrons from the light-absorbing layer 16 to the contact layer 22 and top electrode 24 to contribute to the electrical output signal of the pBn photodetector 10 in the absence of any reverse-bias voltage. Photogenerated holes from the light-absorbing layer 16 also move to the InP substrate 12 and are collected by the bottom electrode 30 to further contribute to the electrical output signal of the pBn photodetector 10. The offset energy in the valence band energy level between the barrier layer 20 and the contact layer 22 blocks holes from the contact layer 22 from moving across the barrier layer 20 and into the light-absorbing layer 16, thereby reducing the dark current in the electrical output signal of the pBn photodetector 10.

In FIG. 4B, with a small reverse-bias voltage of, for example, 0.4 Volts applied across the pBn photodetector 10, the conduction and valence band energy levels are further shifted and bent to provide a further improvement in performance of the pBn photodetector 10 by increasing the dynamic resistance of the photodetector 10. In this case, the offset energy in the valence band energy level between the InAlAs barrier layer 20 and the InGaAs contact layer 22 is not appreciably changed by the reverse-bias voltage so that holes from the contact layer 22 are still blocked to suppress the dark current in the pBn photodetector 10. As noted before, the application of the reverse-bias voltage splits the Fermi energy level $E_f$ into a pair of quasi-Fermi levels which are shown in FIG. 4B as the two short-dash lines.

Figure 5A:
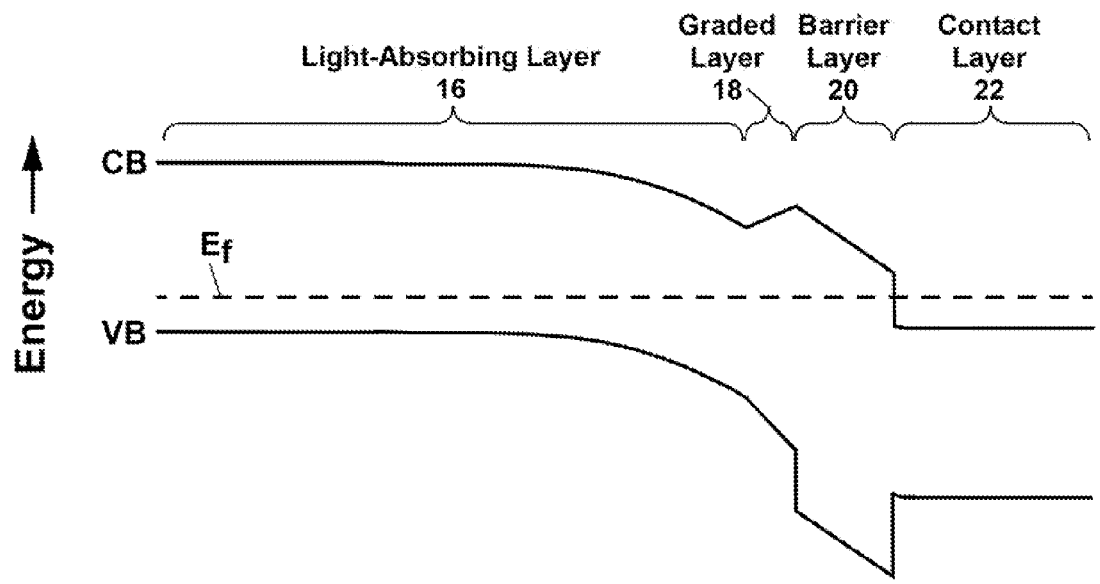
FIG. 5A illustrates an energy level diagram similar to that of FIG. 4A but with an InP barrier layer being substituted for the InAlAs barrier layer in the pBn photodetector. No bias voltage is applied to the pBn photodetector for this energy level diagram.
Figure 5B:
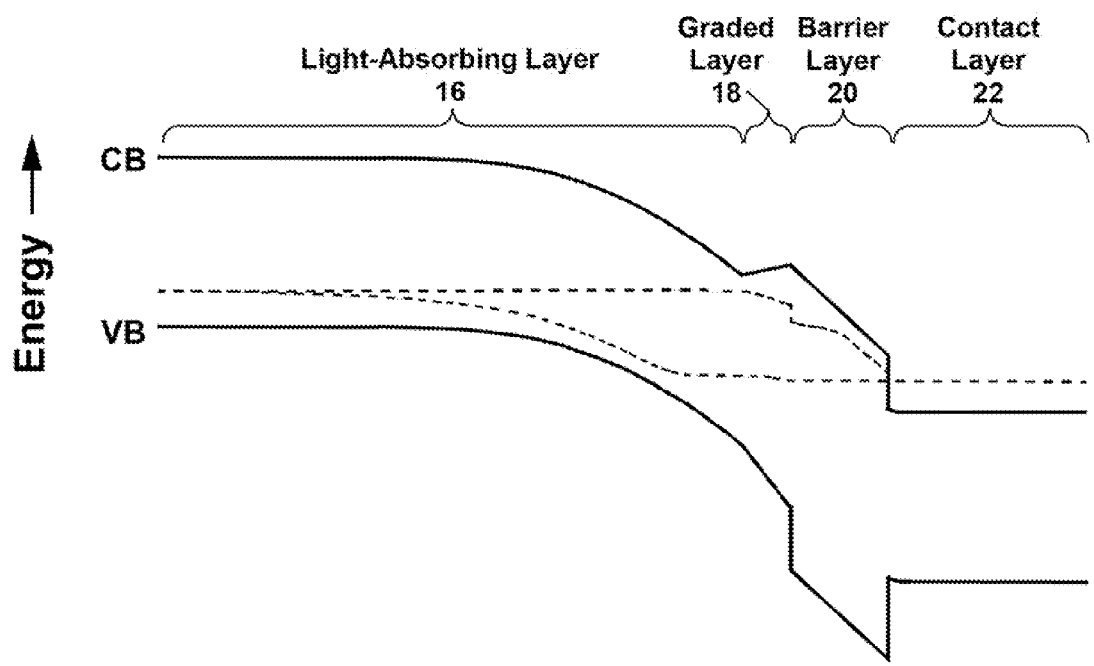
FIG. 5B illustrates how the energy level diagram of FIG. 5A is further modified with a reverse-bias voltage of 0.4 Volts applied across the pBn photodetector.

FIGS. 5A and 5B are similar to FIGS. 4A and 4B but with a pBn photodetector 10 having an InP barrier layer 20. The use of InP for the barrier layer 20 provides an energy offset in the conduction band energy level between the InP barrier layer 20 and the InGaAs light-absorbing layer 16 which is smaller than that for the InAlAs barrier layer 20 while at the same time providing an energy offset in the valence band energy level between the layers 16 and 20 which is larger than that for the InAlAs barrier layer 20. Thus, without any applied bias voltage in FIG. 5A and with doping of the various III-V semiconductor layers 14 as described previously, a lower energy barrier for photogenerated electrons in the conduction band is presented by the InP barrier layer 20 thereby allowing the photogenerated electrons in the light-absorbing layer 16 to more easily move across the InP barrier layer 20 to the contact layer 22 to contribute to the electrical output signal of the pBn photodetector 10. The larger energy offset in the valence band energy level between the InP barrier layer 20 and the InGaAs contact layer 22 more efficiently blocks the transport of holes from the InGaAs contact layer 22 to reduce noise in the output signal of the pBn photodetector 10.

In FIG. 5B, the application of a small reverse-bias voltage (e.g. 0.4 Volts) across the pBn photodetector 10 further reduces the energy offset in the conduction band energy level between the InP barrier layer 20 and the InGaAs light-absorbing layer 16 to further enhance the transport of photogenerated electrons across the barrier layer 20 while also increasing the dynamic resistance of the pBn photodetector 10. With this applied reverse-bias voltage, the energy offset in the valence band energy level between the InP barrier layer 20 and the InGaAs contact layer 22 is only slightly reduced so that holes from the contact layer 22 are blocked, thereby reducing the dark current in the output signal of the pBn photodetector 10.

It should be noted that when InP is used for the barrier layer 20, it is not possible to grade the effective semiconductor alloy composition of the InAlGaAs graded layer 18 so that the valence band energy of the InAlGaAs graded layer 18 is substantially equal to the valence band energy of the InP barrier layer 20. As a result, there is a relatively large offset of about 0.2 electron volts (eV) in the valence band energy level at an interface between the InAlGaAs graded layer 18 and the InP barrier layer 20 (see FIGS. 5A and 5B). This relatively large valence-band energy offset between the layers 18 and 20 does not affect the performance of the pBn photodetector 10 in FIGS. 5A and 5B, but it would present a barrier for photogenerated holes in an nBp photodetector having an InP barrier layer 20; and thus would degrade the performance of such a device. For this reason, an nBp photodetector would not be formed using an InP barrier layer 20. Instead, the barrier layer 20 in an nBp photodetector 10 of the present invention preferably comprises InAlAs.

Figure 6:
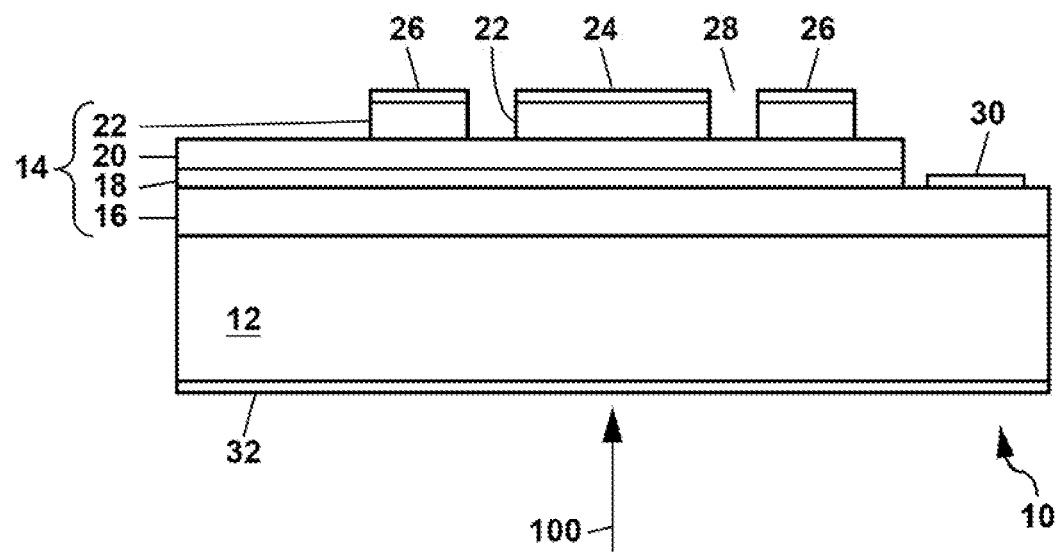
FIG. 6 shows a schematic cross-section view of a second example of a photodetector formed according to the present invention.

FIG. 6 shows a schematic cross-section view of a second example of a photodetector 10 formed according to the present invention. The photodetector 10 of FIG. 6 can be formed using the same III-V compound semiconductor layers 14 as the photodetector 10 of FIG. 1 but has a bottom electrode 30 which is deposited onto an exposed portion of the InGaAs light-absorbing layer 16 instead of being deposited onto a bottom surface of the InP substrate 12 as in the example of FIG. 1. This arrangement in FIG. 6 allows the near-infrared light 100 to be transmitted through the InP substrate 12 to the InGaAs light-absorbing layer 16 and is useful, for example, when an array of photodetectors 10 (e.g. a focal plane array) is being formed according to the present invention since such a photodetector array can comprise a large number of thousands to millions of individual photodetectors 10 which are closely spaced together and with a size of each photodetector 10 being, for example, 5-10 μm square. Such an array of photodetectors 10 can be mated to a readout integrated circuit (ROIC) using a plurality of solder bump bonds to make the electrical connections between the photodetectors 10 and the ROIC. In a focal plane array (FPA), the photodetectors 10 of the present invention are useful for imaging applications with a high sensitivity including imaging using illumination by nightglow radiation.

In the example of FIG. 6, an anti-reflection coating 32 can be optionally deposited over the bottom surface of the InP substrate 12 to reduce the reflection of the near-infrared light 100 from the substrate 12. The photodetector 10 in the example of FIG. 6 can be formed as an nBp or pBn photodetector 10 using either InAlAs or InP for the barrier layer 20 as described previously.

The matter set forth in the foregoing description and accompanying drawings is offered by way of illustration only and not as a limitation. The actual scope of the invention is intended to be defined in the following claims when viewed in their proper perspective based on the prior art.

What is claimed is:
1. A photodetector, comprising:
an indium phosphide (InP) substrate;
a plurality of III-V compound semiconductor layers epitaxially grown on the InP substrate including:
a light-absorbing layer comprising indium gallium arsenide (InGaAs) located above the InP substrate;
an indium aluminum gallium arsenide (InAlGaAs) graded layer located above the light-absorbing layer;
a barrier layer comprising indium aluminum arsenide (InAlAs) or InP located above the InAlGaAs graded layer, with the barrier layer having an energy level which is different from the energy level of the light-absorbing layer; and
a contact layer comprising InGaAs located above the barrier layer;
a first electrode electrically connected to the light-absorbing layer; and
a second electrode electrically connected the contact layer.
2. The photodetector of claim 1 wherein the light-absorbing layer is n-type doped, and the photodetector is an nBp photodetector.
3. The photodetector of claim 1 wherein the light-absorbing layer is p-type doped, and the photodetector is a pBn photodetector.
4. The photodetector of claim 1 wherein a portion of the contact layer is etched down to the barrier layer to define a lateral extent of the photodetector.
5. The photodetector of claim 1 wherein a last-grown portion of the light-absorbing layer has a dopant concentration which is greater than the dopant concentration of the remainder of the light-absorbing layer, and a first-grown portion of the barrier layer is doped with a doping type which is opposite the doping type of the light-absorbing layer, with the remainder of the barrier layer being undoped.

6. The photodetector of claim 5 wherein the last-grown portion of the light-absorbing layer is a few nanometers thick, and the first-grown portion of the barrier layer is a few nanometers thick.

7. The photodetector of claim 1 wherein the InAlGaAs graded layer comprises an effective semiconductor alloy composition $In_Y(Al_XGa_{1-X})_{1-Y}As$, with Y being selected to substantially lattice-match the InAlGaAs graded layer to the InP substrate, and with X being substantially equal to zero proximate to the light-absorbing layer, and with X being substantially equal to unity at a location proximate to the barrier layer.

8. The photodetector of claim 1 wherein the InAlGaAs graded layer comprises an effective semiconductor alloy composition $In_Y(Al_XGa_{1-X})_{1-Y}As$ with Y being selected to substantially lattice-match the InAlGaAs graded layer to the InP substrate, and with X being substantially equal to zero proximate to the light-absorbing layer, and with X having a value at a location proximate to the barrier layer to provide a conduction band energy level of the InAlGaAs graded layer which is substantially equal to the conduction band energy level of the barrier layer.

9. The photodetector of claim 1 wherein the InAlGaAs graded layer comprises an effective semiconductor alloy composition $In_Y(Al_XGa_{1-X})_{1-Y}As$ with Y being selected to substantially lattice-match the InAlGaAs graded layer to the InP substrate, and with X being substantially equal to zero proximate to the light-absorbing layer, and with X having a value at a location proximate to the barrier layer to provide a valence band energy level of the InAlGaAs graded layer which is substantially equal to the valence band energy level of the barrier layer.

10. The photodetector of claim 1 wherein the light-absorbing layer absorbs light in a wavelength range of about 0.9 microns to about 1.7 microns.

11. The photodetector of claim 1 wherein at least one of the first and second electrodes has an annular shape.

12. A photodetector, comprising:
   an indium phosphide (InP) substrate;
   a plurality of III-V compound semiconductor layers epitaxially grown on the InP substrate including:
      a light-absorbing layer comprising indium gallium arsenide (InGaAs) located above the InP substrate, with the InGaAs being n-type doped;
      an indium aluminum gallium arsenide (InAlGaAs) graded layer located above the light-absorbing layer;
      a barrier layer comprising indium aluminum arsenide (InAlAs) located above the InAlGaAs graded layer, with the barrier layer having a valence band energy level which is different from the valence band energy level of the light-absorbing layer; and
      a contact layer comprising InGaAs located above the barrier layer, with the InGaAs being p-type doped;
   a first electrode electrically connected to the light-absorbing layer; and
   a second electrode electrically connected to the contact layer.

13. The photodetector of claim 12 wherein a last-grown portion of the light-absorbing layer is n-type doped with a dopant concentration which is greater than the dopant concentration of the remainder of the light-absorbing layer, and a first-grown portion of the barrier layer is p-type doped, with the remainder of the barrier layer being undoped.

14. The photodetector of claim 12 wherein a portion of the contact layer is etched down to the barrier layer to define a lateral extent of the photodetector.

15. The photodetector of claim 12 wherein the InAlGaAs graded layer comprises an effective semiconductor alloy composition $In_Y(Al_XGa_{1-X})_{1-Y}As$ with Y being selected to substantially lattice-match the InAlGaAs graded layer to the InP substrate, and with X being substantially equal to zero proximate to the light-absorbing layer, and with X being substantially equal to unity proximate to the barrier layer.

16. A photodetector, comprising:
   an indium phosphide (InP) substrate;
   a plurality of III-V compound semiconductor layers epitaxially grown on the InP substrate including:
      a light-absorbing layer comprising indium gallium arsenide (InGaAs) located above the InP substrate, with the InGaAs being p-type doped;
      a indium aluminum gallium arsenide (InAlGaAs) graded layer located above the light-absorbing layer;
      a barrier layer comprising indium aluminum arsenide (InAlAs) located above the InAlGaAs graded layer, with the barrier layer having a conduction band energy level which is different from the conduction band energy level of the light-absorbing layer; and
      a contact layer comprising InGaAs located above the barrier layer, with the InGaAs being n-type doped;
   a first electrode electrically connected to the light-absorbing layer; and
   a second electrode electrically connected to the contact layer.

17. The photodetector of claim 16 wherein a last-grown portion of the light-absorbing layer has a p-type dopant concentration which is greater than the dopant concentration of the remainder of the light-absorbing layer, and a first-grown portion of the barrier layer is n-type doped, with the remainder of the barrier layer being undoped.

18. The photodetector of claim 16 wherein a portion of the contact layer is etched down to the barrier layer to define a lateral extent of the photodetector.

19. The photodetector of claim 16 wherein the InAlGaAs graded layer comprises an effective semiconductor alloy composition $In_Y(Al_XGa_{1-X})_{1-Y}As$ with Y being selected to substantially lattice-match the InAlGaAs graded layer to the InP substrate, and with X being substantially equal to zero proximate to the light-absorbing layer, and with X being substantially equal to unity proximate to the barrier layer.

20. A photodetector, comprising:
   an indium phosphide (InP) substrate;
   a plurality of III-V compound semiconductor layers epitaxially grown on the InP substrate including:
      a light-absorbing layer comprising indium gallium arsenide (InGaAs) located above the InP substrate, with the InGaAs being p-type doped;
      an indium aluminum gallium arsenide (InAlGaAs) graded layer located above the light-absorbing layer;
      a barrier layer comprising InP located above the InAlGaAs graded layer, with the InP barrier layer having a conduction band energy level which is different from the conduction band energy level of the light-absorbing layer; and
      a contact layer comprising InGaAs located above the barrier layer, with the InGaAs being n-type doped;
   a first electrode electrically connected to the light-absorbing layer; and
   a second electrode electrically connected to the contact layer.

21. The photodetector of claim 20 wherein a last-grown portion of the light-absorbing layer has a p-type dopant concentration which is greater than the dopant concentration of the remainder of the light-absorbing layer, and a first-grown portion of the barrier layer is n-type doped, with the remainder of the barrier layer being undoped.

22. The photodetector of claim 20 wherein a portion of the contact layer is etched down to the barrier layer to define a lateral extent of the photodetector.

23. The photodetector of claim 20 wherein the InAlGaAs graded layer comprises an effective semiconductor alloy composition $In_Y(Al_XGa_{1-X})_{1-Y}As$ with Y being selected to substantially lattice-match the InAlGaAs graded layer to the InP substrate, and with X being substantially equal to zero proximate to the light-absorbing layer, and with X having a value at a location proximate to the barrier layer to provide a conduction band energy level of the InAlGaAs graded layer which is substantially equal to the conduction band energy level of the barrier layer.

* * * * *